United States Patent
Grubic et al.

(10) Patent No.: US 10,184,985 B2
(45) Date of Patent: Jan. 22, 2019

(54) SYSTEMS AND METHODS FOR CRACK DETECTION IN DOUBLY-FED INDUCTION GENERATORS

(71) Applicant: General Electric Company, Schenectady, NY (US)

(72) Inventors: Stefan Grubic, Albany, NY (US); Manoj Ramprasad Shah, Latham, NY (US); Prabhakar Neti, Rexford, NY (US); Pinjia Zhang, Clifton Park, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 353 days.

(21) Appl. No.: 14/971,464

(22) Filed: Dec. 16, 2015

(65) Prior Publication Data

US 2017/0176536 A1    Jun. 22, 2017

(51) Int. Cl.
*G01R 31/34* (2006.01)
*F03D 17/00* (2016.01)
*G01R 31/44* (2006.01)

(52) U.S. Cl.
CPC ............. *G01R 31/34* (2013.01); *F03D 17/00* (2016.05); *G01R 31/44* (2013.01)

(58) Field of Classification Search
CPC ..... G01R 31/34; G01R 31/343; G01R 31/346
See application file for complete search history.

(56) References Cited

U.S. PATENT DOCUMENTS

| 4,689,546 A | 8/1987 | Stephens et al. |
| 5,514,978 A | 5/1996 | Koegl et al. |
| 2005/0035768 A1 | 2/2005 | Rabach et al. |
| 2010/0277137 A1 | 11/2010 | Zhao et al. |
| 2013/0234435 A1 | 9/2013 | Wagoner et al. |

(Continued)

FOREIGN PATENT DOCUMENTS

| CN | 101588112 A | 11/2009 |
| WO | 2014131768 A1 | 9/2014 |

OTHER PUBLICATIONS

Popa et al.,"Condition monitoring of wind generators," Conference Record of the Industry Applications Conference, 2003. 38th IAS Annual Meeting. vol. 3, pp. 1839-1846 Oct. 2003.

(Continued)

*Primary Examiner* — Tung X Nguyen
(74) *Attorney, Agent, or Firm* — GE Global Patent Operation; Nitin Joshi

(57) ABSTRACT

A fault detection system for a wind turbine includes a doubly-fed induction generator (DFIG). The DFIG includes a wye-ring configured for at least three electrical phases. The fault detection system includes a data acquisition system including at least three sensors. Each sensor of said at least three sensors is configured to electrically couple with and measure a respective voltage of each phase of the at least three electrical phases of the wye-ring. The fault detection system further includes an alert system coupled to said data acquisition system. The alert system is configured to apply a Fourier transform to the respective measured voltages of each phase of the at least three electrical phases of the wye-ring. The alert system is further configured to provide an indication of a condition of the wye-ring based upon the transformed measured voltages.

18 Claims, 8 Drawing Sheets

(56) References Cited

U.S. PATENT DOCUMENTS

| | | |
|---|---|---|
| 2014/0197825 A1 | 7/2014 | Thegel et al. |
| 2014/0246855 A1* | 9/2014 | Vasak .................... G01R 31/42 290/44 |
| 2015/0026964 A1 | 1/2015 | Neumann et al. |
| 2015/0145554 A1 | 5/2015 | Moldenhauer et al. |
| 2016/0033580 A1 | 2/2016 | Qiao et al. |
| 2017/0248124 A1* | 8/2017 | Hammerum ............ F03D 7/045 |

OTHER PUBLICATIONS

Mahadanaarachchi, "Fault analysis and Protection of Doubly Fed Induction Generator-based Wind Farms", Masters Thesis, Oklahoma University, May 2009.

Mahadanaarachchi, "Fault analysis and Protection of Doubly Fed Induction Generator-based Wind Farms", Masters Thesis, Oklahoma University, May 2009, 105 pages.

Extended European Search Report and Opinion issued in connection with corresponding EP Application No. 16206411.7 dated Jul. 18, 2017.

* cited by examiner

SYSTEMS AND METHODS FOR CRACK DETECTION IN DOUBLY-FED INDUCTION GENERATORS

BACKGROUND

The field of this disclosure relates generally to electric power systems, and more specifically, to the detection of defects in connecting rings for a doubly-fed induction generator (DFIG) rotor of a wind turbine.

Many known renewable energy facilities are coupled to an electric utility grid, and some of these facilities include wind turbines. Generally, a wind turbine includes a rotor that includes a rotatable hub assembly having multiple blades. The blades transform wind energy into a mechanical rotational torque that drives one or more generators via the rotor. At least some known wind turbines are physically nested together in a common geographical region to form a renewable energy generation facility known as a wind turbine farm, sometimes referred to as a wind farm or a wind park.

Many known wind turbines include a DFIG that transforms mechanical energy into electrical energy. DFIGs include a multiphase rotor and a stator. The electrical phases of the multiphase rotor of the DFIG are coupled by a ring that is referred to as an end-ring, a neutral-ring, or a wye-ring. Some known DFIG generator rotors have a floating neutral point, which is frequently provided by the wye-ring. The wye-ring is typically made from a copper bar and is located at the non-drive end (NDE) of the generator. The wye-ring includes three connection points, i.e., one connection point for each phase of a three-phase rotor.

Due to operational stresses which fatigue the brazed connection between the wye-ring and its rotor connection points (or connection lugs), cracks can develop which lead to discontinuity. When a first crack occurs between two of the three connection points, the generator typically continues to function satisfactorily since current continues to reach all three rotor connection points. However, if a second crack, i.e., a two-crack condition, occurs in the wye-ring between another two connection points, at least one part, e.g., one phase, of the rotor windings is disconnected from the floating neutral in an open circuit condition, which can result in arcing across one of the cracks, and possible damage to insulation around the wye-ring and a resultant reduction in service life of the generator. The wind turbine monitoring system detects this cross-over arcing condition and recognizes it as a phase fault, and accordingly shuts the wind turbine down. Wye-ring failure can lead to an extended downtime and an expensive repair of the turbine.

A known method of testing for cracks in the wye-ring requires first taking the turbine offline, at least partially dismantling the generator, injecting a test current into connector lugs of the wye-ring structure, and then measuring the current flow, typically using an oscilloscope, at two or more of the wye-ring connection lugs. Taking the turbine offline creates an undesirable loss of energy production while the turbine is non-operational, and dismantling the generator before determining whether there is actually a crack in the wye-ring that requires repair can increase the maintenance cost of the turbine.

BRIEF SUMMARY OF THE INVENTION

A fault detection system for a wind turbine is provided herewith which includes a doubly-fed induction generator (DFIG) having a three-phase wye-ring. The fault detection system also includes a data acquisition system including three sensors. Each sensor is configured to electrically couple with and measure a respective voltage of each phase of the three-phase wye-ring. The fault detection system further includes an alert system which applies a Fourier transform to the respective measured voltages of each phase of the three-phase wye-ring. Based upon the transformed measured voltages, the alert system provides an indication of a condition of the wye-ring.

BRIEF DESCRIPTION

In one aspect, a fault detection system for a wind turbine is provided. The fault detection system includes a doubly-fed induction generator (DFIG). The DFIG includes a wye-ring configured for at least three electrical phases. The fault detection system includes a data acquisition system including at least three sensors. Each sensor of said at least three sensors is configured to electrically couple with and measure a respective voltage of each phase of the at least three electrical phases of the wye-ring. The fault detection system further includes an alert system coupled to said data acquisition system. The alert system is configured to apply a Fourier transform to the respective measured voltages of each phase of the at least three electrical phases of the wye-ring. The alert system is further configured to provide an indication of a condition of the wye-ring based upon the transformed measured voltages.

In another aspect, a method for determining a physical asymmetry in a multi-phase wye-ring of a doubly-fed induction generator (DFIG) is provided. The method includes measuring a voltage of each phase of the multi-phase wye-ring and applying a Fourier transform to the respective measured voltages of each phase of the multi-phase wye-ring. The method further includes assigning a fault indicator value for the multi-phase wye-ring.

In yet another aspect, a wind park is provided. The wind park includes a plurality of wind turbines. Each wind turbine of the plurality of wind turbines includes a doubly-fed induction generator (DFIG). The plurality of wind turbines thereby includes a plurality of DFIGs. At least one DFIG of the plurality of DFIGs is electrically coupled to a utility grid. Each DFIG of the plurality of DFIGs includes a respective wye-ring configured for at least three electrical phases. Each phase of the at least three electrical phases exhibits a measurable voltage. The wind park further includes an alert system configured to calculate a fundamental voltage component for each DFIG. The alert system is further configured to display a respective indicator for each DFIG. Each respective indicator indicates a mechanical condition of each respective wye-ring.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION OF THE INVENTION

Figure 1:
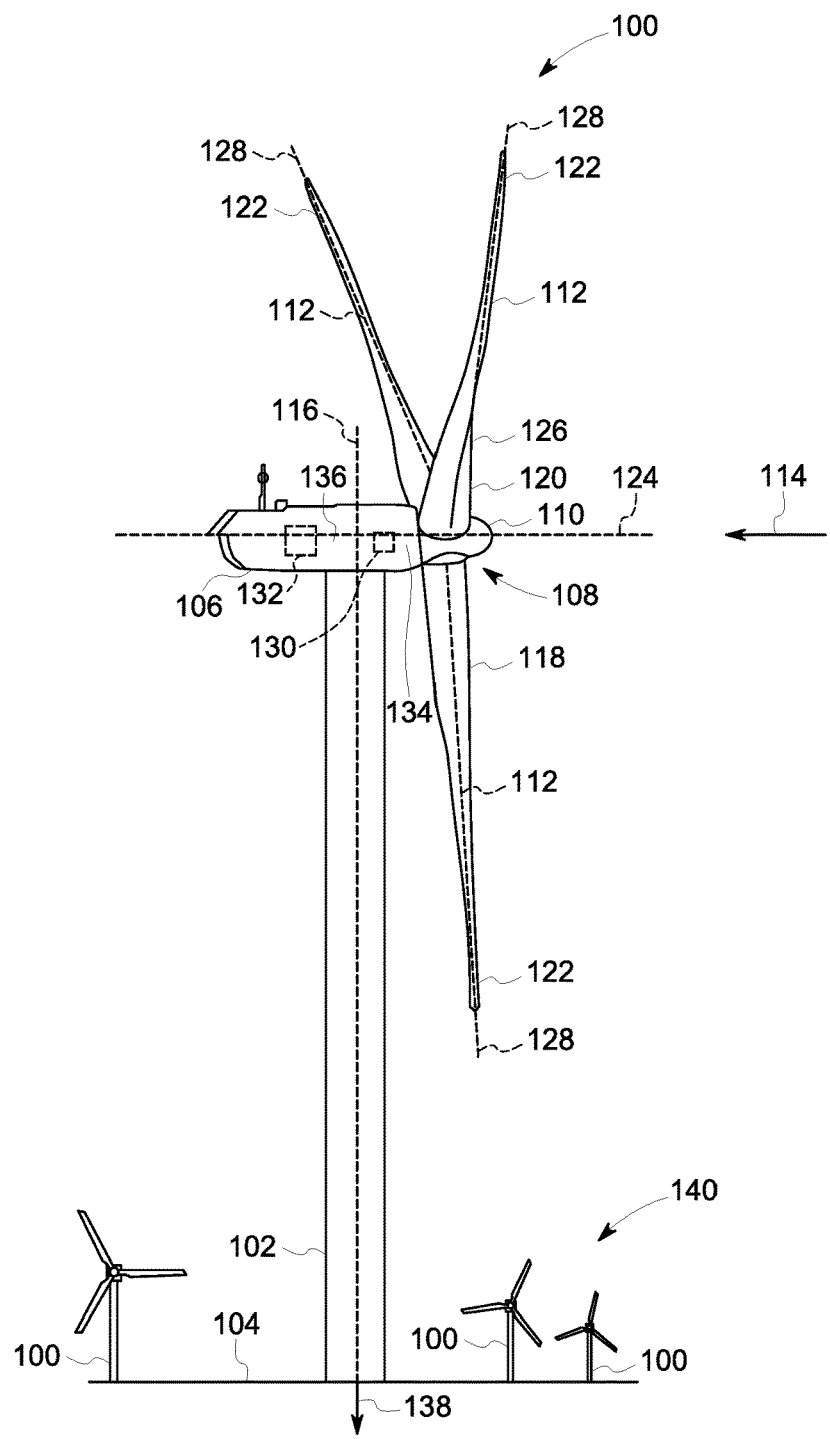
FIG. 1 is a perspective view of an exemplary wind turbine and wind park.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

The systems and methods of the embodiments described herein are useful to identify a defect in a wye-ring of a doubly-fed induction generator (DFIG) rotor at an incipient stage. The embodiments herein provide an early warning against physical damage to the rotor, which facilitates preventing unexpected arcing across the generator due to an open circuit in the rotor circuit. Early intervention, after the identification of the incipient wye-ring crack, can reduce repair costs to a wind turbine, and avoid extended outage and the related financial losses due to unplanned outages.

FIG. 1 is a schematic view of an exemplary wind turbine 100. In the exemplary embodiment, wind turbine 100 is a horizontal-axis wind turbine. Alternatively, wind turbine 100 may be a vertical-axis wind turbine. Wind turbine 100 includes a tower 102 extending from and coupled to a supporting surface 104. Tower 102 may be coupled to surface 104 with anchor bolts or via a foundation mounting piece (neither shown). A nacelle 106 is coupled to tower 102, and a main shaft assembly 108 is coupled to nacelle 106. Main shaft assembly 108 includes a rotatable hub 110 and a plurality of rotor blades 112 coupled to hub 110. In the exemplary embodiment, main shaft assembly 108 includes three rotor blades 112. Alternatively, main shaft assembly 108 may have any suitable number of rotor blades 112 to enable wind turbine 100 to function as described herein. Tower 102 may have a suitable height and/or construction that enables wind turbine 100 to function as described herein.

Rotor blades 112 are spaced about hub 110 to facilitate rotating main shaft assembly 108, thereby transferring kinetic energy from wind 114 into usable mechanical energy, and subsequently, electrical energy. Main shaft assembly 108 and nacelle 106 are rotated about tower 102 on a yaw axis 116 to control a perspective of rotor blades 112 with respect to a direction of wind 114. Rotor blades 112 are mated to hub 110 by coupling a rotor blade root portion 118 to hub 110 at a plurality of load transfer regions 120. Load transfer regions 120 each have a hub load transfer region and a rotor blade load transfer region (both not shown in FIG. 1). Loads induced to rotor blades 112 are transferred to hub 110 via load transfer regions 120. Each rotor blade 112 also includes a rotor blade tip portion 122.

In the exemplary embodiment, rotor blades 112 have a length of between approximately 30 meters (m) (99 feet (ft)) and approximately 120 m (394 ft). Alternatively, rotor blades 112 may have any suitable length that enables wind turbine 100 to function as described herein. For example, rotor blades 112 may have a suitable length less than 30 m or greater than 120 m. As wind 114 contacts rotor blade 112, lift forces are induced to rotor blade 112 and rotation of main shaft assembly 108 about an axis of rotation 124 is induced as rotor blade tip portion 122 is accelerated.

A pitch angle (not shown) of rotor blades 112, i.e., an angle that determines the perspective of rotor blade 112 with respect to the direction of wind 114, may be changed by a pitch assembly (not shown in FIG. 1). More specifically, increasing a pitch angle of rotor blade 112 decreases an amount of rotor blade surface area 126 exposed to wind 114 and, conversely, decreasing a pitch angle of rotor blade 112 increases an amount of rotor blade surface area 126 exposed to wind 114. The pitch angles of rotor blades 112 are adjusted about a pitch axis 128 at each rotor blade 112. In the exemplary embodiment, the pitch angles of rotor blades 112 are controlled individually. Further, wind turbine 100 includes a main gearbox 130 and a generator 132 within nacelle 106. In the exemplary embodiment, main shaft assembly 108 includes a low-speed shaft 134 that extends into main gearbox 130 and a high-speed shaft 136 that extends to generator 132.

During operation, wind impacts rotor blades 112, which transform mechanical wind energy into a mechanical rotational torque that rotatingly drives low-speed shaft 134 by hub 110. Low-speed shaft 134 drives gearbox 130, which subsequently steps up a low rotational speed of low-speed shaft 134 to drive high-speed shaft 136 at an increased rotational speed. High-speed shaft 136 drives generator 132, which then generates power to be transmitted to an electrical utility grid (not shown) over a grid bus 138. A plurality of wind turbines 100 form a wind park 140. Each of the plurality of wind turbines 100 in wind park 140 is constructed similarly to one another, and each wind turbine 100 includes a generator 132 which generates power to be transmitted to the electrical utility grid.

Figure 2:
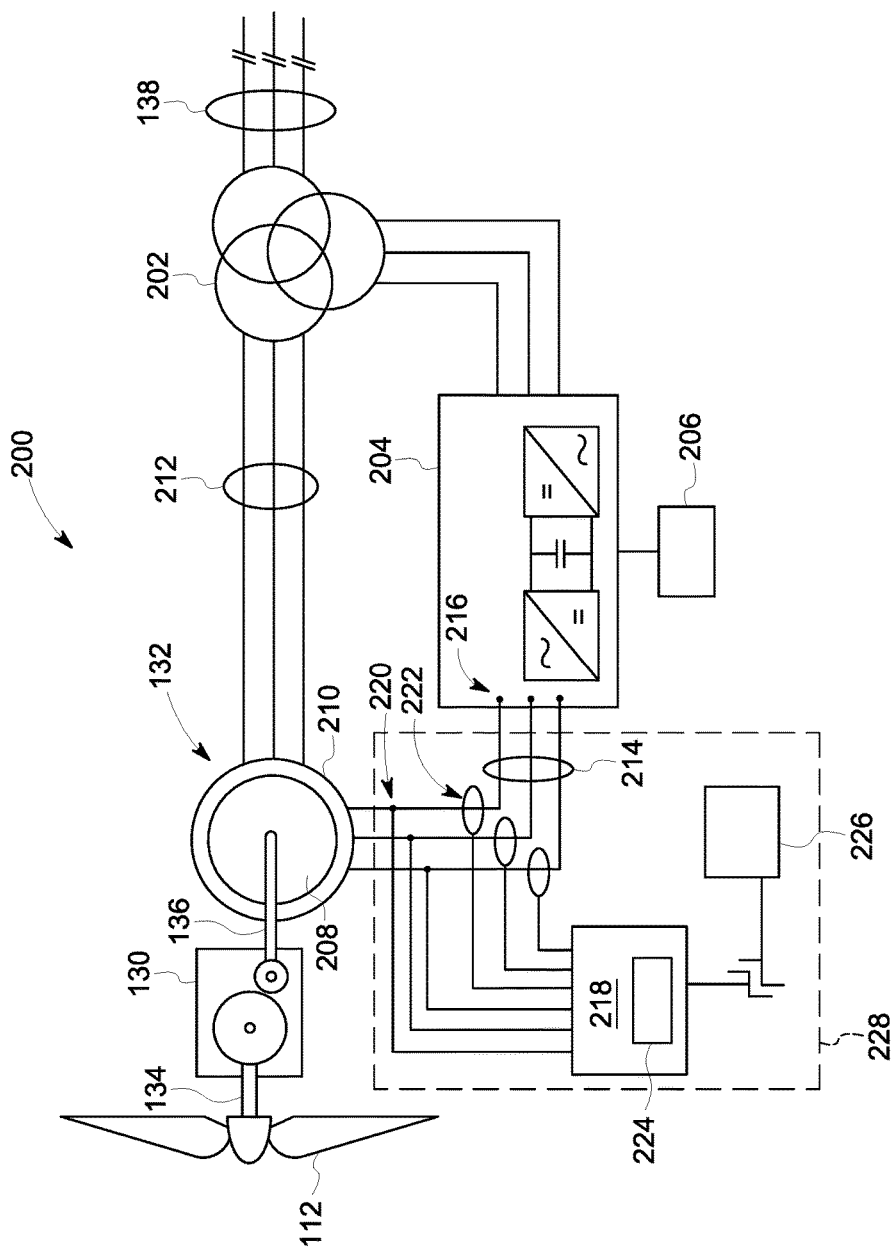
FIG. 2 is a schematic view of an exemplary electrical system of the wind turbine shown in FIG. 1.

FIG. 2 is a schematic view of an exemplary electrical power system 200 for wind turbine 100 (shown in FIG. 1). In the exemplary embodiment, electrical power system 200 converts the mechanical energy of rotor blades 112, low-speed shaft 134, gearbox 130, high-speed shaft 136, and generator 132 into electrical energy to transmit over grid bus 138 to the utility grid (not shown) through a transformer 202. Rotor blades 112 mechanically couple with gearbox 130 through low-speed shaft 134, and gearbox 130 mechanically couples with generator 132 through high-speed shaft 136. Electrical power system 200 further includes a controller 206 coupled in electronic data communication with power converter 204 to control the operation of power converter 204. In one embodiment, controller 206 is a portion of a separate, stand-alone unit from power converter 204. In an alternative embodiment, controller 206 is integrated with power converter 204. In the exemplary embodiment, generator 132 is a DFIG including a rotor 208, and a stator 210 magnetically coupled to rotor 208.

In operation, high speed shaft 136 rotatingly drives rotor 208. A rotating magnetic field is induced within rotor 208 and a voltage is induced within stator 210. In the exemplary embodiment, generator 132 converts the rotational mechanical energy to a sinusoidal, three-phase alternating current (AC) electrical energy signal in stator 210. The associated electrical power is transmitted to transformer 202 by a stator bus 212. Transformer 202 is configured to step up the voltage amplitude of the electrical power, and the subsequently transformed electrical power is further transmitted to an electrical utility grid (not shown) by grid bus 138.

In the doubly-fed induction generator configuration, a second electrical power transmission path is provided. Electrical, three-phase, sinusoidal, AC power is generated within rotor 208 and is transmitted to power converter 204 by a rotor bus 214. Power converter 204 includes additional components, such as line contactors 216 that electrically couple to each of the individual power lines (not numbered) of rotor bus 214.

Electrical power system 200 is further configured to measure rotor voltages in generator 132. The rotor voltages can be recorded in several ways. In the exemplary embodiment, the rotor voltage measurements are obtained using signals acquired by line contactors 216, for example, and then communicated with controller 206 through electronic data communication from power converter 204, and then used for analysis. In this embodiment, there are at least three line contactors 216 contacting each of at least three power lines (not separately numbered) of rotor bus 214, and line contactors 216 thereby function as sensors configured to acquire data of the rotor voltage measurements and communicate this data, either by direct wiring or wireless transmission, to a processor (not shown) of power converter 204 or controller 206, which includes, without limitation, a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processor capable of executing the functions described herein. Alternatively, the processor is remotely located, and includes a receiver (not shown) capable of receiving voltage measurement data acquired by line contactors 216.

In a further alternative embodiment, a separate data acquisition system (DAQ) 218 is utilized to measure rotor voltages in generator 132. When optionally implemented, DAQ 218 is coupled directly to rotor bus 214 through a plurality of acquisition connectors 220, which transmit measured rotor voltages to DAQ 218, directly or by transmitters (not shown) capable of transmitting voltage data to respective receivers (not shown) within DAQ 218. Alternatively, or additionally, DAQ 218 is configured to receive current measurement data from sensors 222, directly or by transmitters (not shown) capable of transmitting data to respective receivers (not shown) within DAQ 218. DAQ further includes an alert system 224 that is configured to process the measured rotor voltage data and transmit an alert to a display 226 based on the processed data, as discussed further below with respect to FIGS. 5-9. The alert can be, without limitation, a warning light, a displayed numerical value, or a visual device that sufficiently represents a condition of rotor 208.

In yet another alternative embodiment, the alert can be an audible alarm or notification. Display 226 can be disposed proximate the location of turbine 100 (shown in FIG. 1) itself, at a remote power station (not shown), and/or on a remote device (also not shown), such as a computer, laptop, tablet, or handheld device, programmed to receive and display processed voltage measurement data.

The voltage measurement, processing, and display capabilities of electrical power system 200 form a fault detection system 228. As shown in FIG. 2, fault detection system includes acquisition connectors 220 and/or sensors 222, DAQ 218, and display 226. Alternatively, fault detection 228 is entirely contained within power converter 204 or controller 206. In this alternative embodiment, line contactors 216 perform the functions of acquisition connectors 220 and sensors 222, the processor (not shown) of power converter 204 or controller 206 performs the data acquisition and processing functions of DAQ 218, and display 226 can be disposed locally or remotely, by direct or wireless coupling.

Figure 3:
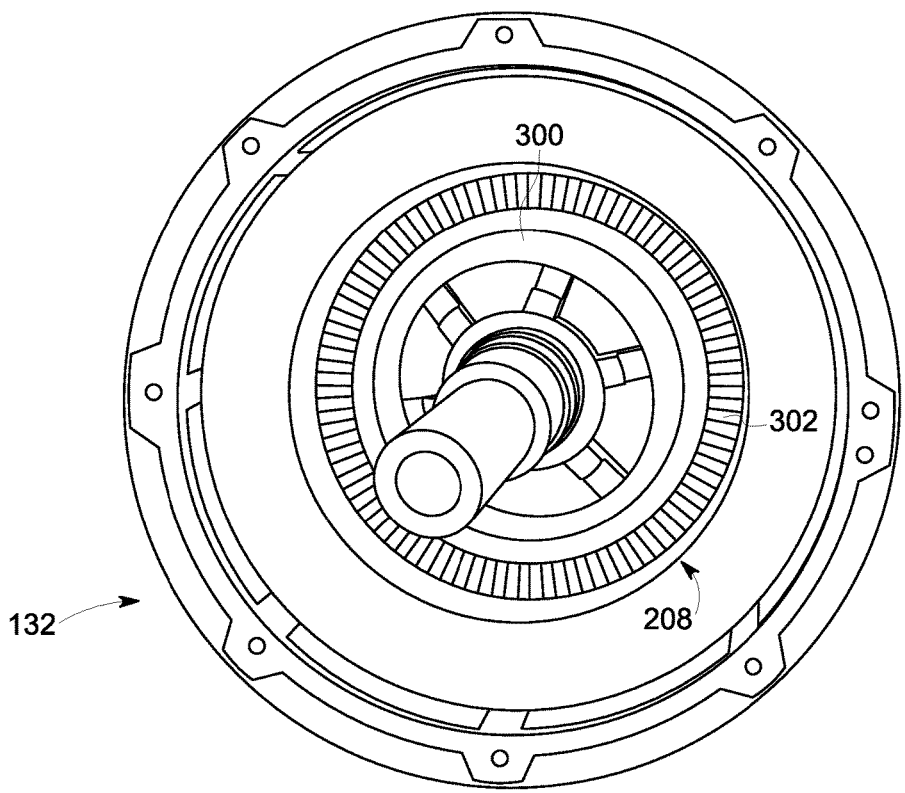
FIG. 3 is a perspective view of an exemplary generator that may be used with the wind turbine shown in FIG. 1.

FIG. 3 is an exemplary view of generator 132 as implemented with wind turbine 100 (shown in FIG. 1). In the exemplary embodiment, generator 132 is a DFIG, and includes a wye-ring 300 and a plurality of end windings 302 that extend circumferentially around rotor 208 (shown in FIG. 2). Wye-ring 300 is disposed radially inside rotor 208 and couples to end windings 302. Wye-ring 300 is typically fabricated of one or more copper bars curved into a generally circular shape. Wye-ring 300 provides a floating, or ungrounded, neutral connection (not numbered and explained further below with respect to FIG. 5) for each of the phases of rotor windings. In the exemplary embodiment, rotor 208 is a three-phase system. In an alternative embodiment, rotor 208 is a multi-phase system, configured for more than three electrical phases. Although not illustrated, generator 132 typically additionally includes a bearing shield and a generator rotor fan.

Figure 4:
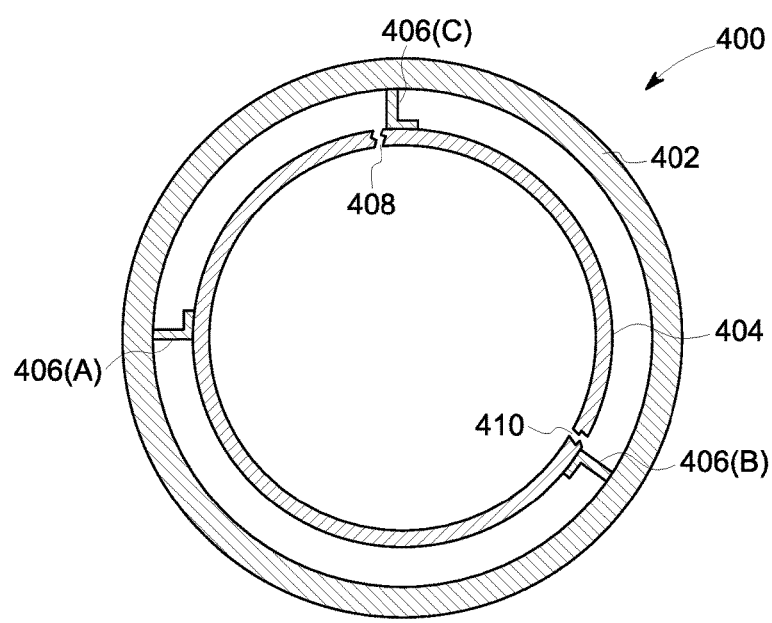
FIG. 4 is a schematic view of a generator having a rotor and windings connected to a wye-ring developing a two-crack condition.

FIG. 4 illustrates a schematic view of rotor 400. Rotor 400 includes a plurality of end windings 402 connected to a wye-ring 404 exhibiting an incipient two-crack condition. Except for the incipient two-crack condition, wye-ring 404 is the same as wye-ring 300 (shown in FIG. 3). Rotor 400 is therefore the same as rotor 208 (shown in FIG. 2), except for the incipient two-crack condition. Rotor 400 further includes connection lugs 406($a$), 406($b$), and 406($c$). Connection lugs 406($a$), 406($b$), and 406($c$) electrically connect wye-ring 404 to end windings 402. In the exemplary embodiment, connection lugs 406 and wye-ring 404 are both made of copper, are brazed together to form a fixed mechanical connection. Alternatively, connection lugs 406 and wye-ring 404 are coupled together by a manufacturing process that enables operation of the DFIG, i.e., generator 132 (shown in FIG. 1), as described herein, including, without limitation, welding or casting a unitary fabrication.

In operation of rotor 400, brazed joints between connection lugs 406 and wye-ring 404 experience strain induced thereon. For example, thermal expansion and contraction may not be uniform between rotor end windings 402 and wye-ring 404, thereby leading to uneven expansion and contraction stresses to individual joints of wye-ring 404, as well as its curved ring portions (not numbered) between connection lugs 406. For example, without limitation, over time, a first crack 408 may form in wye-ring 404 near connection lug 406($c$). Rotor 400 will typically function with only a single crack. With only a single crack, i.e., first crack 408, current will flow through wye-ring 404 between connection lugs 406($b$) and 406($a$), and wye-ring 404 between connection lugs 406($b$) and 406($c$). However, first crack 408 proximate connection lug 406($c$) imposes additional loads on connection lugs 406($a$) and 406($b$), and increase the stresses thereupon, and may accelerate development of a second crack 410. Once second crack 410 fully develops proximate connection lug 406($b$), an entire phase of rotor 400, i.e., at connection lug 406($a$), is isolated from a floating neutral of rotor 400 (explained further below with respect to FIG. 5). Arcing between cracks can occur, and undesirably affect rotor insulation (not shown).

In this embodiment, cracks are discussed as being formed near connection lugs. However, in general, first and second cracks 408, 410 in wye-ring 404 may occur anywhere along wye-ring 404 between connection lugs 406, and induce similar stresses thereon. Additionally, and as described in greater detail below, second crack 410 is either incipient, i.e., only partially developed through wye-ring 404 prior to phase isolation from the floating neutral, or fully developed. The systems and methods described further below are capable of monitoring wye-ring 404 during operation such that incipient cracks can be detected and monitored before becoming fully developed cracks.

Figure 5:
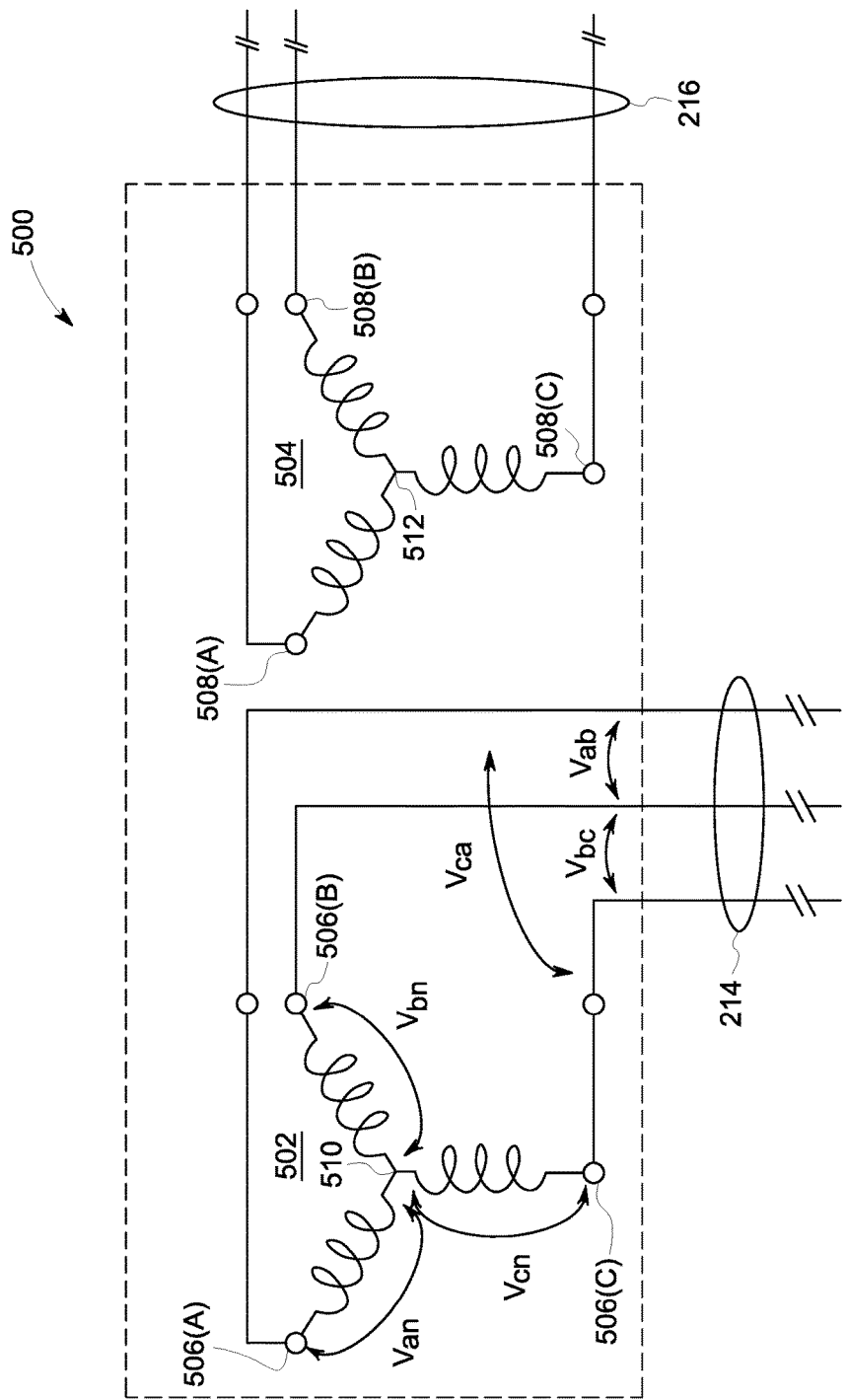
FIG. 5 is a schematic view of an exemplary electrical system of the generator shown in FIGS. 2 and 3.

FIG. 5 illustrates a schematic of an exemplary electrical system 500 of generator 132, FIGS. 2-3. Electrical system 500 includes a rotor circuit 502, i.e., of rotor 208, FIG. 2, and a stator circuit 504, i.e., of stator 210, FIG. 2. Rotor circuit 502 includes a rotor phase 506($a$), a rotor phase 506($b$), and a rotor phase 506($c$) that correspond to, that is, electrical magnetically coupled with, a stator phase 508(A), a stator phase 508(B), and a stator phase 508(C) of stator circuit 504, respectively. Rotor circuit 502 further includes a neutral point 510 corresponding to a neutral point 512 of stator circuit 504. Neutral point 510 is, in this example, a floating neutral. Rotor circuit 502 electrically couples to power converter 204, FIG. 2, by rotor bus 214. Similarly, stator circuit 504 electrically couples to transformer 202, FIG. 2, by stator bus 212.

In operation, electrical, three-phase, sinusoidal, AC power is generated within rotor circuit 502 and transmitted over rotor bus 214. Additionally, voltage and current measurements can be taken at rotor phase 506($a$), 506($b$), and 506($c$), e.g., by line contactors 216 (shown in FIG. 2). From these voltage and current measurements, symmetrical components of the zero sequence, the positive sequence, and the negative sequence are utilized to analyze the three-phase power system. These symmetrical components are generated by complex linear transformation of the measured voltage and current values, that is, the calculation allows conversion between the phase and symmetrical component domains, using methods including, without limitation, Laplace and Fourier transform algorithms. As discussed below in further detail, the respective negative sequence components of the complex voltage and current vectors are used for further analysis. To determine the positive and the negative sequence components of voltages and currents of rotor circuit 502, at rotor phases 506($a$), 506($b$), and 506($c$), the complex voltage vector $\bar{V}_r$ and the complex current vector $\bar{I}_r$ are calculated as follows:

$$\bar{V}_r = V_{ab} + V_{bc} e^{-j2\pi/3} + V_{ca} e^{j2\pi/3} \qquad \text{(Eq. 1)}$$

$$\bar{I}_r = I_{ar} + I_{br} e^{-j2\pi/3} + I_{cr} e^{j2\pi/3} \qquad \text{(Eq. 2)}$$

where $V_{ab}$, $V_{bc}$, and $V_{ca}$ are the measured line-to-line voltages between rotor phases 506($a$), 506($b$), and 506($c$), respectively and $I_{ar}$, $I_{br}$, and $I_{cr}$ are the measured rotor line currents of rotor phases 506($a$), 506($b$), and 506($c$), respectively. Additionally, the above calculations are made using the line-to-line voltages from the respective rotor phases. Line-to-line voltages are convenient to obtain because it is typically convenient to take voltage measurements at rotor phases 506($a$), 506($b$), and 506($c$) by accessing rotor bus 214 at line contactors 216, for example.

Figure 6:
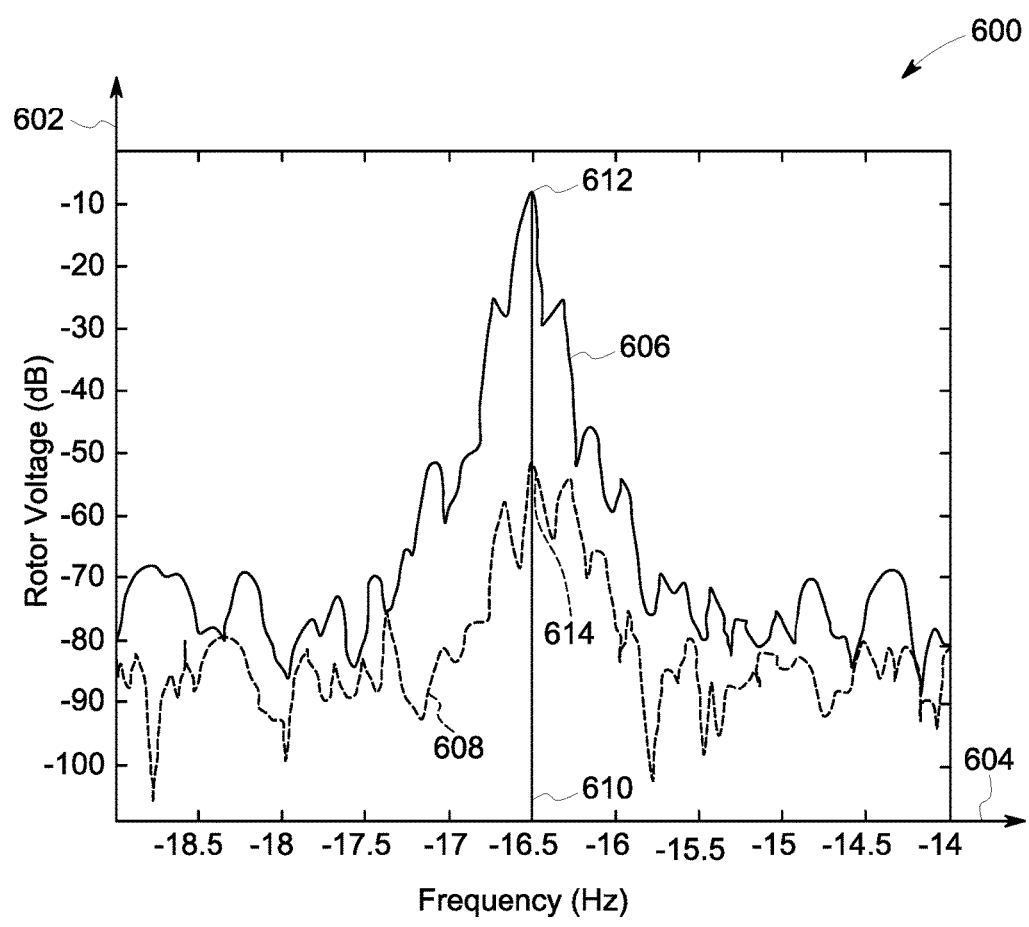
FIG. 6 is a graphical representation comparing voltage negative sequence components from an operational wye-ring with a voltage negative sequence components from a wye-ring developing a two-crack condition.
Figure 7:
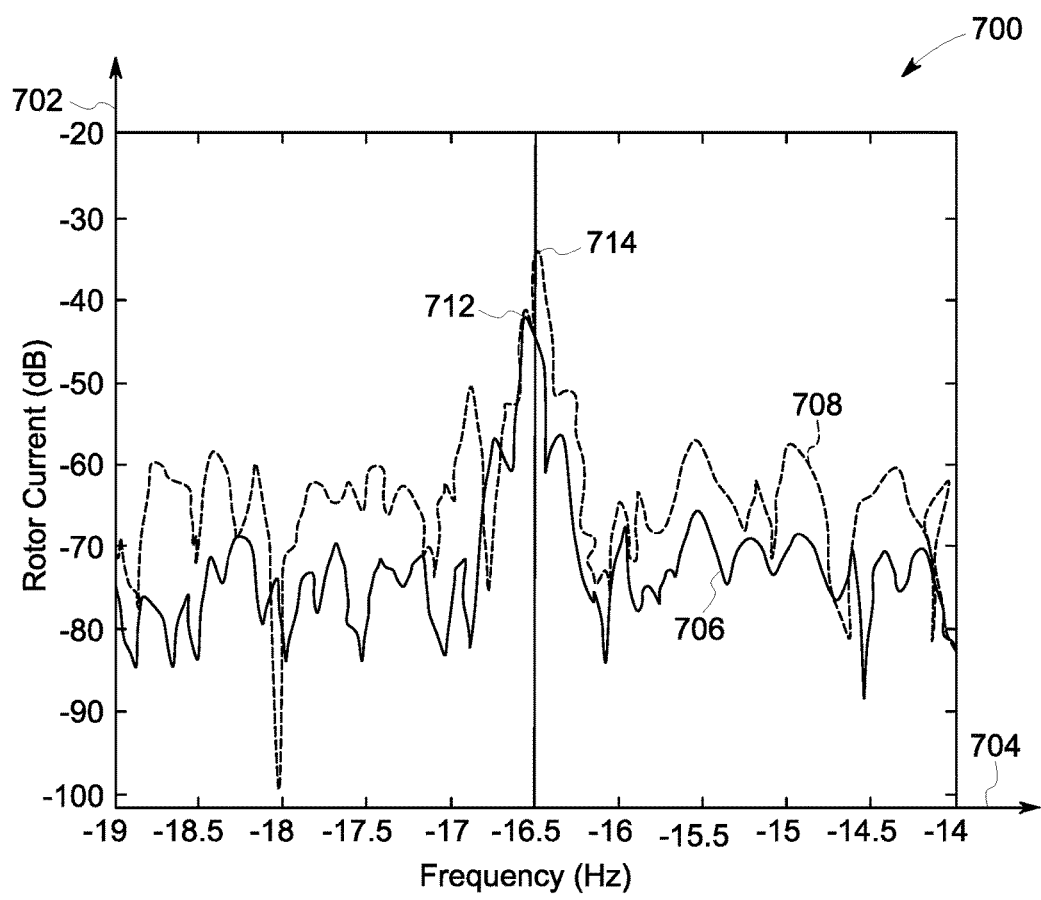
FIG. 7 is a graphical representation comparing current negative sequence components from an operational wye-ring with a current negative sequence components from a wye-ring developing a two-crack condition.

FIGS. 6 and 7 illustrate graphical representations utilizing the complex voltage and current vectors, respectively, according to the calculations above, plotted against frequency. In an exemplary embodiment, once the complex voltage vector and the complex current vector are obtained, a Fast-Fourier transform (FFT) is applied to both complex vectors to convert the measured voltage data from the time domain to the frequency domain. The results of the transformed vectors are discrete values which can be plotted against frequency, as discussed below.

Referring to FIG. 6, a voltage transform graph 600 includes a y-axis 602 (height direction) representing the transformed voltage vector magnitude, in units of decibels (dB), and an x-axis 604 (longitudinal dimension) representing frequency, in units of Hertz (Hz). Since an FFT is used to transform the complex voltage vector, the vertical scale of y-axis 604 represents relative power, which is best shown in dB. Voltage transform graph 600 superimposes a first voltage plot 606 with a second voltage plot 608, with both first and second voltage plots 606, 608 representing the distribution of discrete values of transformed complex voltage vectors against frequency. First plot 606 represents the distribution of transformed complex voltage vectors generated by measuring the phase voltages for wye-ring 404, exhibiting an incipient two-crack condition, as shown in FIG. 4. Second voltage plot 608 comparably represents the distribution of discrete values of transformed complex voltage vectors for wye-ring 300, FIG. 3, which has not developed an incipient two-crack condition, and therefore considered "healthy".

In operation, once the transformed complex voltage vector values are obtained for first plot 606 and second plot 608, these values are normalized over the spectrum to determine the fundamental operating frequency $f_1$ of the rotor voltage. The fundamental operating frequency $f_1$ is determined as the frequency at which the normalized values exhibit the largest magnitude component in the frequency spectrum. Once the fundamental operating frequency $f_1$ is determined, a negative fundamental frequency 610 is identified as being the negative of the fundamental operating frequency $-f_1$. At negative fundamental frequency 610, the normalized, transformed complex voltage vectors experience a peak magnitude, which is also known as the negative sequence component at the fundamental operating frequency. In the example shown in voltage transform graph 600, negative fundamental frequency 610 has a value of −16.5 Hz.

Although not shown, the transformed complex voltage vectors will exhibit a positive sequence component at the fundamental operating frequency of 16.5 Hz. In the exemplary embodiment, potential rotor imbalance is predicted by examining the negative sequence components. Specifically, a first peak magnitude 612 of first voltage plot 606 and a second peak magnitude 614 of second plot 608 substantially align at negative fundamental frequency 610. Peak magnitude 612, which corresponds to wye-ring 404 (shown in FIG. 4), having an incipient two-crack condition, is substantially larger than peak magnitude 614, which corresponds to healthy wye-ring 300 (shown in FIG. 3).

In an alternative embodiment, a comparison of the phase-to-phase voltages can also indicate the probability of a developing, that is, incipient, two-crack condition, as shown in FIG. 4. According to this alternative embodiment, once the voltage measurements are taken at rotor phases 506(a), 506(b), 506(c), each of the phase-to-phase voltages $V_{ab}$, $V_{bc}$, and $V_{ca}$ is individually transformed into the frequency domain without having to calculate the complex voltage vector. Once transformed, the respective component that exhibits the lowest magnitude will indicate the two corresponding phases that have the healthiest section of wye-ring therebetween, e.g, portion of wye-ring 404 (shown in FIG. 4), between connection lugs 406(a) and 406(b). As a further example, and without limitation, if the frequency-transformed component of $V_{ab}$ has the lowest magnitude out of the three frequency-transformed phase-to-phase voltages, there is a greater probability that cracks have been forming in wye-ring 404 between rotor phases 506(a) and 506(c), and between rotor phases 506(b) and 506(c), than between rotor phases 506(a) and 506(b), as best seen in FIG. 5. These frequency-transformed phase-to-phase voltage fundamental components may also indicate the relative health of individual sections, such as between connection lugs, of a single wye-ring with respect to its other sections.

This alternative embodiment may also be utilized together with the calculation of the transformed complex voltage vector, described above. When so utilized together, the transformed complex voltage vector is useful for comparing the relative overall condition of a wye-ring from one wind turbine in a wind park with that of another wye-ring from a different wind turbine in the same wind park. In contrast, the phase-to-phase voltage comparisons are useful in assessing the condition of one phase of a particular wye-ring with other phases of the same wye-ring.

In another alternative embodiment, useful indicators are obtained utilizing the root mean square (RMS) of the line-to-line voltages. For example, and similar to the example immediately above, when the RMS value of $V_{ab}$ has the lowest magnitude out of the three line-to-line voltages, there is a greater probability that cracks have been forming in wye-ring 404, (shown in FIG. 4), between rotor phases 506(a) and 506(c), and also between rotor phases 506(b) and 506(c), than between rotor phases 506(a) and 506(b), as best seen in FIG. 5. As with the example above, this alternative embodiment may also be utilized together with calculations of the transformed complex voltage vector. Whereas the RMS values are indicative of the location of an imbalance between rotor phases 506, the RMS values, by themselves, are less indicative of quantified information, such as the magnitude of an imbalance formed by an incipient, developing crack.

In still another alternative embodiment, if access to rotor neutral point 510 can be conveniently obtained, the complex rotor voltage vector is determined by measuring line-to-neutral (also known as "phase-to-neutral") voltages $V_{an}$, $V_{bn}$, and $V_{cn}$ rather than of the line-to-line measurements, described above.

Referring now to FIG. 7, a current transform graph 700 includes a y-axis 702 (height direction) representing the transformed current vector magnitude, in units of dB, and an x-axis 704 (longitudinal dimension) representing frequency, in units of Hz. Similar to voltage transform graph 600, the results of the transformed complex current vector from the FFT are also shown in dB. Current transform graph 700 superimposes a first current plot 706 with a second current plot 708. First current plot 706 represents a distribution of discrete values of transformed complex current vectors (also in units of dB) against frequency (again in units of Hz), for wye-ring 404, exhibiting an incipient two-crack condition, as shown in FIG. 4. Second current plot 708 comparably represents a distribution of discrete values of transformed complex current vectors against frequency for wye-ring 300 (shown in FIG. 3), which has not developed an incipient two-crack condition.

In operation, once the transformed complex current vector values are obtained for first current plot 706 and second current plot 708, these values are also normalized to determine the fundamental operating frequency $f_1$ of the rotor current in the same manner that the fundamental operating frequency $f_1$ was determined for the rotor voltage, as discussed above. A negative fundamental frequency 710 of the rotor current is therefore also −16.5 Hz, in the embodiment shown with respect to FIG. 6. In this exemplary embodiment, a first peak magnitude 712 of first current plot 706 and a second peak magnitude 714 of second current plot 708 substantially align at negative fundamental frequency 710. Comparing voltage transform graph 600 with current transform graph 700, it can be seen that negative fundamental frequency 610 is consistent with negative fundamental frequency 710 weather measuring voltage or current. Looking at FIG. 7 in particular, graph 700 illustrates that peak magnitude 712, corresponding to an incipient two-crack condition, is substantially similar to peak magnitude 714, which corresponds to an operational wye-ring.

This comparison of FIG. 6 with FIG. 7 illustrates a distinct advantage of the present embodiments over conventional systems that measure only rotor currents. In operation, there is a presumption that rotor current is well controlled in a DFIG, e.g., generator 132, FIG. 2, by the DFIG controller, e.g., controller 206 (shown in FIG. 2). When the DFIG controller is functioning properly, rotor currents at the fundamental operating frequency are regulated to form a substantially balanced three-phase system even in the presence of a physical asymmetry in the rotor. Accordingly, by examining the negative sequence components of the fundamental operating frequency, physical asymmetry from a cracked wye-ring (partially or completely) is more clearly reflected from the applied rotor voltages than from the rotor currents. A detected imbalance from the measured voltages is indicative of an operational physical asymmetry of the wye-ring, such as from an incipient or fully developed first crack, or from a developing two-crack condition.

Figure 8:
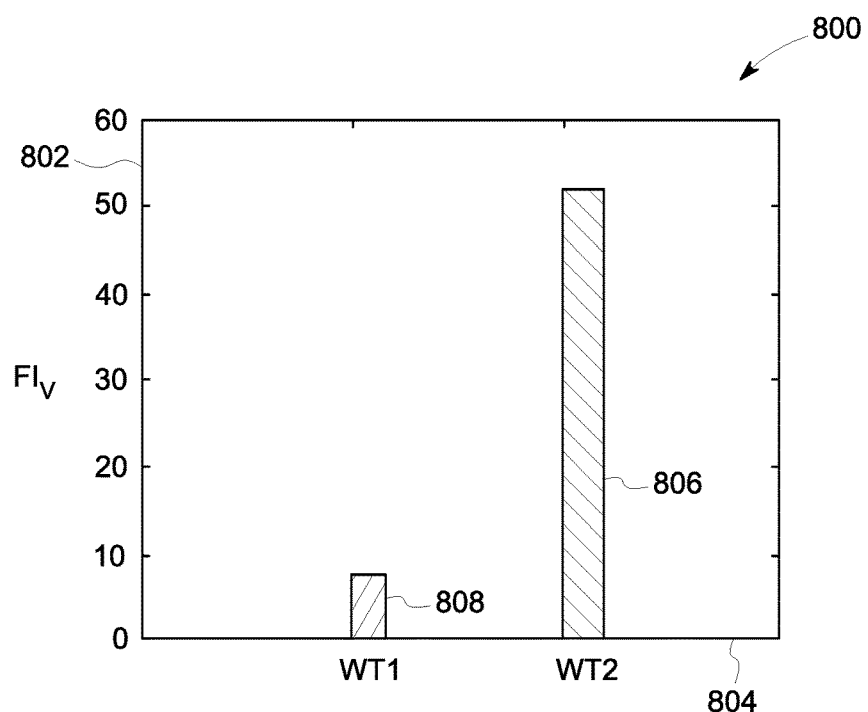
FIG. 8 is a graphical representation comparing a voltage fault indicator from an operational wye-ring with a voltage fault indicator of a wye-ring developing a two-crack condition.
Figure 9:
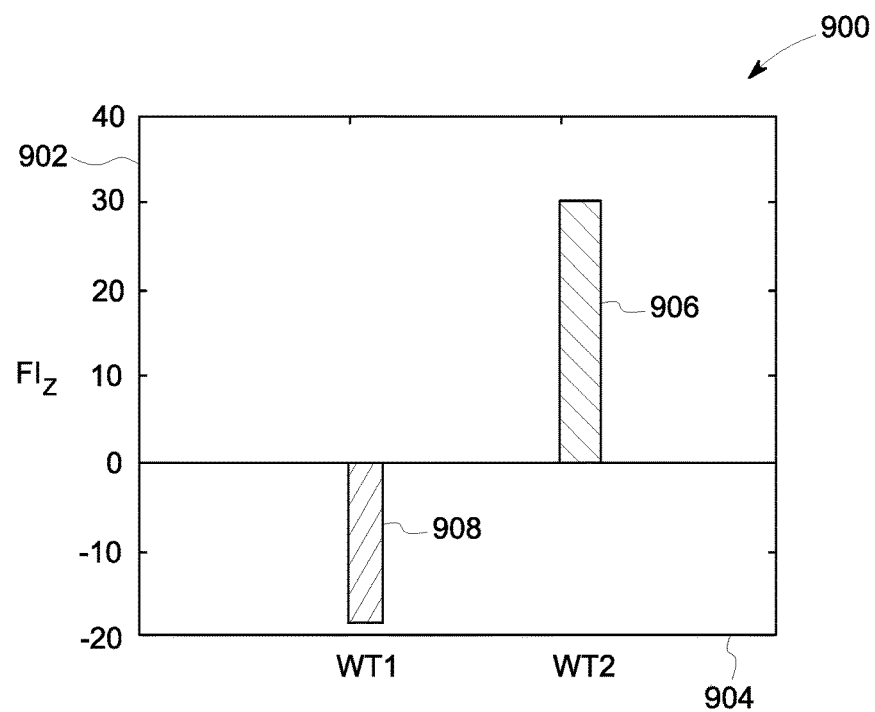
FIG. 9 is a graphical representation comparing an impedance fault indicator from an operational wye-ring with an impedance fault indicator of a wye-ring developing a two-crack condition.

FIGS. 8 and 9 illustrate graphical representations displaying comparative voltage and current fault indicators ($FI_V$ and $FI_I$, respectively) between an operational wye-ring with a wye-ring developing an incipient two-=crack condition. Referring to FIG. 8 specifically, bar graph 800 includes a vertical axis 802 representing the magnitude of a fault indicator based on measured voltages, and a horizontal axis 804 representing which of a plurality of individual wind turbines (e.g. wind park 140, FIG. 1), WT1, WT2, etc., is measured. In this exemplary embodiment, bar graph 800 represents visual data depicted on a physical display screen (e.g., display 226, FIG. 2) of a first voltage fault indicator 806 and a second voltage fault indicator 808. First voltage fault indicator 806 indicates the physical asymmetry of a wind turbine generator WT1 having a wye-ring, e.g., wye-ring 404 (shown in FIG. 4), exhibiting an incipient two-crack condition. Second voltage fault indicator 808 indicates the relative physical asymmetry of a wind turbine generator WT2 a wye-ring, e.g., wye-ring 300 (shown in FIG. 3), without an incipient two-crack condition. A comparison of first voltage fault indicator 806 with second voltage fault indicator 808 indicates that an incipient two-crack condition is present for wye-ring 404, and not present for wye-ring 300.

First and second voltage fault indicators 806, 808 relate in magnitude to respective normalized values of peak magnitudes 612, 614, as shown in FIG. 6, which are the identified negative sequence components of the transformed voltages. That is, the respective values of fault indicator 806, 808 are assigned based at least in part on the Fourier transform of the voltages measured at each phase of the wye-ring, e.g. wye-ring 300, FIG. 3, wye-ring 404, FIG. 4. The negative sequence components of the transformed complex rotor voltage vectors (shown in FIG. 6) are first normalized, and thereby converted into discrete numerical fault indicator values (shown in FIG. 8) to more accurately predict the probability of damage to a wye-ring (such as from an incipient two-crack condition). A larger numerical value for a fault indicator will indicate a greater probability that the wye-ring is damaged. The "zero" value on vertical axis 802 can be set by an arbitrary offset number for illustrative purposes. In an exemplary embodiment, the zero value of vertical axis 802 is set to a baseline value of a new rotor and wye-ring measured at first operation.

In operation, a DFIG controller, e.g., controller 206 (shown in FIG. 2), is programmed to monitor rotor voltages, e.g., from line contactors 216, and calculate complex voltage and current vectors, negative sequence components, and discrete fault indicators, as described above, according to an exemplary embodiment. In an alternative embodiment, a separate data acquisition circuit, e.g. DAQ 218 (shown in FIG. 2), is programmed to monitor the same rotor voltages e.g., from acquisition connectors 220, and perform the same calculations. In yet another alternative embodiment, similar calculations can be performed by separate or integrated devices, including, without limitation, a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein that are capable of receiving data acquired by sensors electrically coupled to rotor phases, e.g., rotor phases 506 (shown in FIG. 5), or to a rotor bus, e.g., rotor bus 214 (shown in FIG. 2).

Once the respective fault indicators for a particular wind turbine are calculated, the fault indicators can be transmitted and displayed as an alert at the location of the turbine itself, at a remote power station, and/or on a remote device, such as a computer, laptop, tablet, or handheld device, programmed to receive and display fault indicator data. In an aspect of the embodiment, the alert is an alarm triggered at the respective display device, e.g., display 226 (shown in FIG. 2) when a fault indicator exceeds a threshold value. As discussed above with respect to FIG. 2, the alert can be, without limitation, a warning light, a displayed numerical value, or a visual device that sufficiently displays the relative magnitude of the respective fault indicator. In yet another alternative embodiment, the alert can be an audible alarm or notification.

In an alternative embodiment, i.e., for wind park 140 (shown in FIG. 1) containing a plurality of individual wind turbines, e.g., wind turbine 100 (shown in FIG. 1), the alert system, e.g., alert system 224 (shown in FIG. 2), is configured to display, i.e., on display 226 (shown in FIG. 2) the respective fault indicators for individual turbines 100 in sequential order, according to the magnitude of the individual fault indicators. Individual turbines 100 displaying the highest magnitude fault indicators will be considered to be those having the highest probability of wye-ring damage, and thus those most in need of service, as compared with others of the plurality of wind turbines. According to a further alternative operation, a change in the magnitude of a particular fault indicator is monitored with respect to time, and a significant increase in the magnitude of the monitored fault indicator over a short period of time will indicate a high probability of a crack developing in the respective wye-ring.

Referring now to FIG. 9, bar graph 900 includes a vertical axis 902 representing the magnitude of an impedance fault indicator ($FI_I$), and a horizontal axis 904 representing which of a plurality of individual wind turbines, e.g., WT1, WT2, etc., is represented. In this exemplary embodiment, bar graph 900 represents visual data depicted on a physical display screen (not shown) of a first impedance fault indicator 906 and a second impedance fault indicator 908. First impedance fault indicator 906 indicates the asymmetry of a wind turbine generator WT1 having a wye-ring, e.g., wye-ring 404 (shown in FIG. 4), exhibiting an incipient two-crack condition. Second impedance fault indicator 908 indicates the asymmetry of a wind turbine generator WT2 a wye-ring, e.g., wye-ring 300 (shown in FIG. 3), without an incipient two-crack condition. In operation, although there is a presumption that rotor current is well controlled in a DFIG, in actuality, this presumption is not always correct. Nevertheless, current measurements from a DFIG can yield useful information as a supplement to the voltage calculations described above.

For example, in the event that the rotor current of the turbine is not sufficiently well-controlled, the ratio of the rotor's negative sequence voltage, e.g., peak magnitudes 612, 614 (shown in FIG. 6), and the rotor's negative sequence current, e.g., peak magnitudes 712, 714 (shown in FIG. 7), respectively, at negative fundamental frequency 610, 710 is calculated to determine respective negative sequence impedance values, the magnitudes of which are used to determine first impedance fault indicator 906 and second impedance fault indicator 908, respectively. Similar to case with voltage fault indicators $FI_V$, a larger numerical value for a impedance fault indicator $FI_I$ will also indicate a greater probability that the wye-ring exhibits an asymmetry in the rotor circuit that stems from a defective wye-ring, such as an incipient two-crack condition.

Figure 10:
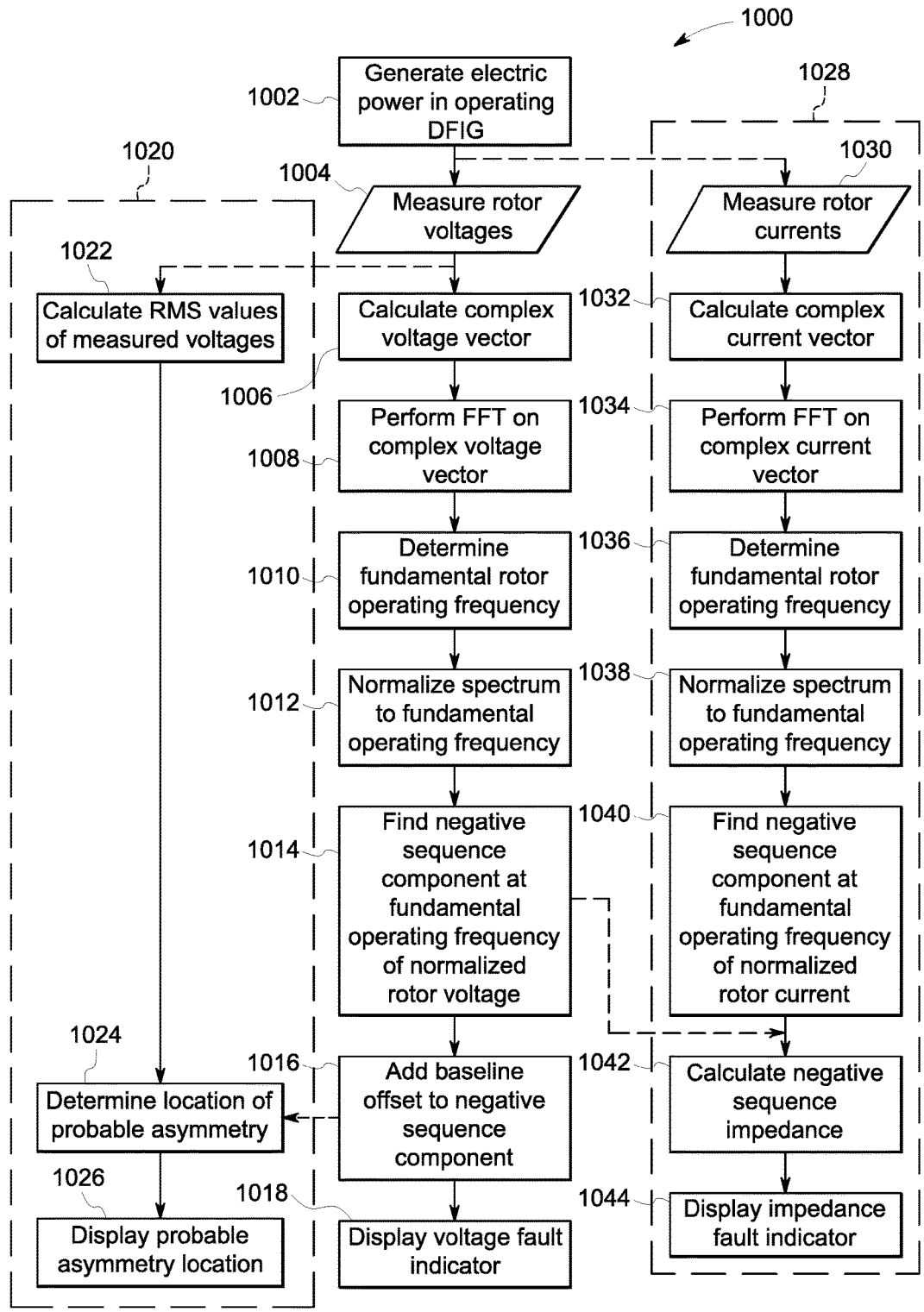
FIG. 10 is a flow chart diagram of a process for determining the fault indicators shown in FIGS. 8 and 9.

FIG. 10 is a flow chart diagram of a process 1000 for determining fault indicators 806, 808, shown in FIG. 8, and 906, 908, shown in FIG. 9, from electrical power system 200, shown in FIG. 2. Process 1000 begins at step 1002. In step 1002, electric power is generated by DFIG 132, shown in FIG. 1. Once DFIG 132 is operational, process 1000 proceeds to step 1004.

Step 1004 is a data collection step. In step 1004, controller 206 or DAQ 218 measures the rotor voltages for each phase, i.e., phase-to-phase, phase-to-neutral, etc., of the particular wye-ring being monitored, e.g., wye-ring 300, shown in FIG. 3, or wye-ring 404, shown in FIG. 4, and then proceeds to step 1006. Step 1006 is a calculation step. In step 1006, process 1000 calculates the complex voltage vector $\nabla_r$ (see Eq. 1, above), and then proceeds to step 1008, which is another calculation step. In step 1008, process 1000 performs an FFT on the calculated complex voltage vector $\nabla_r$ to convert the measured data into the frequency domain.

Once the calculated complex voltage vector $\nabla_r$ is transformed into the frequency domain, process 1000 proceeds to step 1010, where the fundamental rotor operating frequency $f_i$ is determined. The fundamental rotor operating frequency $f_i$ can be determined by identifying the frequency at which the peak magnitude of the transformed complex voltage vector $\nabla_r$ occurs. Once the fundamental rotor operating frequency $f_i$ is determined, process 1000 proceeds to step 1012, which is a further calculation step. In step 1012, the entire measured frequency spectrum was normalized to the fundamental operating frequency $f_i$ to cancel out units of voltage, and thus be able to analyze the measured and converted data values simply as logarithmic magnitudes.

Once the spectrum of data is normalized to the fundamental operating frequency $f_i$, process 1000 proceeds to step 1014, where the this negative sequence component at the fundamental operating frequency of normalized rotor voltage is identified. This step is also referred to as determining the peak magnitude, e.g. peak magnitude 612 or 614, of the normalized, transformed complex voltage vector $\nabla_r$ at negative fundamental frequency 610.

The negative sequence component identified in step 1014 can be directly implemented as the voltage fault indicator $FI_V$, and thus process 1000 can skip step 1016, and proceed directly to step 1018, where the voltage fault indicator $FI_V$ is directly displayed, e.g., on display 226, shown in FIG. 2, as a discrete quantifiable value. In an alternative embodiment, process 1000 instead proceeds from step 1014 to optional step 1016, where a baseline offset value is added to the logarithmic negative sequence component identified in step 1014. The baseline offset value can be determined by running process 1000 against a brand-new turbine and rotor are known to be healthy. In a further alternative, the baseline offset value can be set according to the initial operation and measurement of the turbine and DFIG now being measured for comparison purposes. Once the baseline offset value is added to the normalized logarithmic negative sequence component, process 1000 will proceed to final step 1018, where the offset value of the negative sequence component is displayed against its baseline value.

In an alternative embodiment, optional sub-process 1020 runs simultaneously main process 1000, and provides supplemental measurements and data information. Referring back to step 1004, process 1000 proceeds to optional step 1022, in addition to step 1006. Optional step 1022 is a calculation step. In step 1022, the RMS values are calculated from the voltages measured in step 1004, and then process 1000 proceeds to step 1024. Step 1024 is also a calculation step. In step 1024, the respective RMS values for each phase are calculated, as described above, and then combined with the offset value of the negative sequence component determined in step 1016. In other words, where the offset value determined in step 1016 is indicative of an incipient one-crack or two-crack asymmetry developing in the wye-ring, e.g., wye-ring 404, this data from step 1016 is combined with the data from step 1024 to determine the location of the problem location of the detected asymmetry.

Process 1000 then proceeds to step 1026, where the combined information from step 1024 can be displayed as the probable location of an asymmetry reflected by the display of the voltage fault indicator $FI_V$. By displaying both pieces of information together, a repair crew, for example, can significantly expedite the repair process of a deteriorating wye-ring, thereby saving both time and financial resources.

In another alternative embodiment, optional sub-process 1028 also, or alternatively, runs simultaneously main process 1000, and provides further supplemental measurements and data information. Referring back to step 1002, process 1000 proceeds to optional step 1030, in addition to step 1004. Optional step 1030 is a calculation step very similar to calculation step 1004. In step 1030, for example, controller 206 or DAQ 218 measures the rotor currents for each phase. In fact, steps 1030 through 1040 of optional sub-process 1028 are nearly identical to mandatory steps 1004 through 1014, except that each of these steps from optional sub-process 1028 performs the same calculations as its mandatory counterpart except only on current data, as opposed to voltage data.

Specifically, optional sub-process 1028 proceeds, in order, to measure rotor currents in step 1030, calculate complex current vector in step 1032 from the measured rotor currents, perform an FFT on the complex current vector $\bar{I}_r$ in step 1034, determine the rotor fundamental operating frequency $f_i$ in step 1036, normalize the measured current vector values over the frequency spectrum to eliminate units of current in step 1038, and find the negative sequence component at the fundamental operating frequency of the normalized rotor current in step 1040.

Optional sub-process 1028 then deviate slightly from the mandatory portion of the process 1000 in proceeding to step 1042. Step 1042 is a calculation step, where the negative sequence impedance is calculated. In an exemplary embodiment of step 1042, the negative sequence impedance is calculated as a ratio of the negative sequence components of the normalized rotor voltage and the normalized rotor current at the fundamental operating frequency $f_f$. In an alternative embodiment of step 1042, the negative sequence impedance is calculated by simply subtracting respective negative sequence components of the normalized rotor current, in dB, from the normalized rotor voltage, also in dB, since the volts and amps units drop out from the normalization process. Once the negative sequence impedance is so calculated, according to either embodiment, process 1000 proceeds to step 1044, where the impedance fault indicator $FI_Z$ is displayed. As discussed above, this additional fault indicator can be useful to determine if, for example, controller 26 is not adequately maintaining the DFIG current within the expected narrow operating parameters.

In the exemplary embodiments described herein, negative sequence components are calculated at negative fundamental frequencies. Alternatively though, similar analyses can be performed utilizing other frequencies that are excited through the operation of the DFIG, depending on the bandwidth of the controller used with the DFIG. In operation, a sufficient controller bandwidth allows the converter, e.g. power converter 204 (shown in FIG. 2) to utilize its switching frequency to calculate the complex voltage and current vectors. To analyze voltage and current measurements at the switching frequency, a higher controller sampling frequency is implemented. Higher bandwidth and sampling frequencies can be obtained by the addition of a data acquisition system (e.g., optional DAQ 218, shown in FIG. 2). As with the embodiments described above, the analysis of the fundamental rotor voltage in this alternative embodiment can also be conducted utilizing command signals generated by software installed on the controller, a separate data acquisition system, or a computing device capable of receiving relevant voltage and current sensor measurements.

According to the embodiments presented herein, whether utilizing the system controller, a separate data acquisition system, or a computer, the voltage and current measurements are obtained from normal operational signals, and while the wind turbine and its generator are fully online and operationally producing electrical power for the utility grid. Present systems and methods are not able to diagnose a developing fault in the wye-ring of the rotor without having to first take the wind turbine off-line and out of service (typically requiring dismantling of the generator), and then without having to inject a separate diagnostic signal into the system (requiring additional hardware), as is conventionally known. The conventional wye-ring diagnosis methods are not performed while the DFIG is generating power to the utility grid.

The systems and methods described herein allow for the early identification of a defect of the wye-ring of a DFIG's rotor at an incipient stage. Through such identification, an early warning can be sent of potential damage to the wye-ring, which can be utilized to prevent an otherwise unexpected open circuit condition in the rotor circuit of the generator. Such early intervention reduces repair costs to the generator, and also avoids extended outage of the wind turbine and increased maintenance and repair costs. When applied to a wind park that includes a plurality of wind turbines, the early warning advantages of the present embodiments advantageously enable a repair/maintenance crew to prioritize wye-ring crack repairs of individual turbines in a desired order, according to which respective rotors exhibit fault indicators having the greatest magnitude.

Exemplary embodiments of wye-ring crack detection in a wind turbine generator and an electric power generation facility, and a system and methods for detecting the same, are described above in detail. The methods, facilities, systems, and apparatus are not limited to the specific embodiments described herein, but rather, components of the facilities, systems, and apparatus, and/or steps of the methods may be utilized independently and separately from other components and/or steps described herein. For example, the exemplary system and methods may also be used in combination with other power conversion apparatus and methods utilizing a DFIG, and are not limited to practice with only the electric power systems as described herein. Rather, the exemplary embodiment can be implemented and utilized in connection with many other DFIG electric power conversion applications.

The above-described integrated sensors and associated sensing systems facilitate extended operation in harsh environments. Specifically, integrating a significant portion of sensing system components in high-temperature and rotatable components during the manufacture of such components reduces the amount of time and resources expended in preparing the high-temperature and rotatable components for insertion into the respective turbomachine after they are manufactured. Further, specifically, the integrated sensors and associated sensing systems described herein include substrate materials and dielectric materials integrated as part of the sensors such that the sensors may be positioned on components, or portions of component, that do not have sufficient substrate and dielectric materials to accept known sensors. Such integration of the sensors with the components includes adding the necessary substrate and/or dielectric materials to the sensors as sensing device features to facilitate placement of the sensors in regions that would otherwise frustrate use of such sensors thereon. Therefore, such integration of the sensors and components facilitates placing the sensors at the most appropriate and desired positions on the components. Further, such integration of the sensors and high-temperature and rotatable components will increase the hurdles to non-OEM (original equipment manufacturer) entities for attempted duplication.

An exemplary technical effect of the methods, systems, and apparatus described herein includes at least one of: (a) integrating sensing system devices in components during the manufacture of such components, thereby reducing the amount of time and resources expended in preparing the components for insertion into the respective turbomachines after they are manufactured; (b) facilitating placement of the sensor components at the most appropriate and desired positions on the high-temperature and rotatable components; (c) positioning sensors in harsh environments that do not have delicate chip features, thereby facilitating more robust sensing devices; (d) providing sensors that embedded within the associated components during manufacture and are not affixed to their associated components subsequent to manufacturing of those components, thereby facilitating sturdier sensing devices; and (e) facilitating passive operation of a machine sensor in a wireless environment.

Although specific features of various embodiments of the invention may be shown in some drawings and not in others, this is for convenience only. In accordance with the principles of the invention, any feature of a drawing may be referenced and/or claimed in combination with any feature of any other drawing.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit any way the definition and/or meaning of the term processor.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A fault detection system for a wind turbine, the wind turbine including a doubly-fed induction generator (DFIG) that includes a wye-ring configured for at least three electrical phases, said fault detection system comprising:
    a data acquisition system comprising at least three sensors, each sensor of said at least three sensors configured to electrically couple with and measure a respective voltage of each phase of the at least three electrical phases of the wye-ring; and
    an alert system coupled to said data acquisition system, said alert system configured to apply a Fourier transform to the respective measured voltages of each phase of the at least three electrical phases of the wye-ring, the alert system further configured to provide an indication of a condition of the wye-ring based upon the transformed measured voltages.

2. The fault detection system in accordance with claim 1, further comprising a power converter, wherein said power converter comprises said data acquisition system.

3. The fault detection system in accordance with claim 1, wherein said at least three sensors are located remotely from said data acquisition system, and wherein said at least three sensors are configured to wirelessly transmit the respective measured voltages to said alert system.

4. The fault detection system in accordance with claim 1, wherein said alert system is configured to apply the Fourier transform based upon line-to-line comparisons of the respective measured voltages of each phase of the at least three electrical phases.

5. The fault detection system accordance with claim 4, wherein said alert system is further configured to apply the Fourier transform to a complex voltage vector of the line-to-line comparisons of the respective measured voltages.

6. The fault detection system in accordance with claim 4, wherein said alert system is further configured to apply a root mean square (RMS) determination to the line-to-line comparisons.

7. The fault detection system in accordance with claim 1, wherein the wye-ring further includes a floating neutral, wherein said alert system is further configured to apply the Fourier transform based upon line-to-neutral comparisons of the respective measured voltages of each phase of the at least three electrical phases of the wye-ring.

8. The fault detection system in accordance with claim 1, wherein said alert system is further configured to transmit the indication of the condition of the wye-ring to a remote display device.

9. A method for determining a physical asymmetry in a multi-phase wye-ring of a doubly-fed induction generator (DFIG), said method comprising:
    generating electric power with the DFIG;
    measuring a voltage of each phase of the multi-phase wye-ring while the DFIG is generating electric power;
    applying a Fourier transform to the respective measured voltages of each phase of the multi-phase wye-ring; and
    assigning a fault indicator value for the multi-phase wye-ring.

10. The method in accordance with claim 9, further comprising calculating a complex voltage vector from the respective measured voltages of each phase of the multi-phase wye-ring.

11. The method in accordance with claim 9, wherein applying the Fourier transform comprises comparing the respective measured voltages of each phase of the multi-phase wye-ring and transforming a result of the comparison into a discrete value in the frequency domain.

12. The method in accordance with claim 11, wherein comparing the respective measured voltages comprises measuring a voltage difference between each phase of the multi-phase wye-ring.

13. The method in accordance with claim 11, wherein the wye-ring further includes a floating neutral, wherein comparing the respective measured voltages comprises comparing a voltage difference between each phase of the multi-phase wye-ring and the floating neutral.

14. The method in accordance with claim 9, wherein assigning the fault indicator value comprises identifying a negative fundamental frequency of the wye-ring.

15. The method in accordance with claim 14, wherein assigning the fault indicator value comprises identifying a negative sequence voltage at the negative fundamental frequency.

16. The method in accordance with claim 15, wherein a magnitude of the assigned fault indicator is based on the identified negative sequence voltage.

17. The method in accordance with claim 16, wherein the magnitude of the assigned fault indicator indicates a probability value that a physical asymmetry of the wye-ring is one of present and not present.

18. The method in accordance with claim 9, wherein measuring a voltage is performed while the DFIG is generating electrical power transmitted to a utility grid.

* * * * *